(12) United States Patent
Akram et al.

(10) Patent No.: US 6,593,196 B2
(45) Date of Patent: *Jul. 15, 2003

(54) METHODS OF FORMING A TRANSISTOR GATE

(75) Inventors: Salman Akram, Boise, ID (US); Akram Ditali, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,255

(22) Filed: Apr. 23, 1999

(65) Prior Publication Data

US 2003/0017689 A1 Jan. 23, 2003

Related U.S. Application Data

(63) Continuation of application No. 08/993,663, filed on Dec. 18, 1997, now Pat. No. 9,292,132.

(51) Int. Cl.$^7$ ............................................. H01L 21/316
(52) U.S. Cl. ...................... 438/303; 438/563; 438/795
(58) Field of Search .................................. 438/528, 556, 438/558, 563, 564, 561, 591, 910, 923, 288, 407, 774, 525, 595, 303, 696, 795

(56) References Cited

U.S. PATENT DOCUMENTS

| 3,933,530 A | 1/1976 | Mueller et al. |
| 4,949,136 A | 8/1990 | Jain |
| 5,225,355 A | 7/1993 | Sugino et al. |

(List continued on next page.)

FOREIGN PATENT DOCUMENTS

| DE | 4229574 A1 | 9/1992 |
| DE | 42 29 574 A1 | 3/1993 |
| JP | 01272161 | 10/1989 |
| JP | 02173611 | 6/1990 |
| JP | 04062974 | 2/1992 |
| JP | 5-102067 | 4/1993 |

OTHER PUBLICATIONS

Improvement of SiO/Si Interface Properties by Fluorine Implantation, K. Ohyyu, Y. Ohji and N. Natsuaki, International Conference on Solid State Devices and Materials, 1988, pp. 607–608.

(List continued on next page.)

Primary Examiner—Savitri Mulpuri
(74) Attorney, Agent, or Firm—Wells St. John P.S.

(57) ABSTRACT

A method of forming a transistor gate includes forming a gate oxide layer over a semiconductive substrate. Chlorine is provided within the gate oxide layer. A gate is formed proximate the gate oxide layer. In another method, a gate and a gate oxide layer are formed in overlapping relation, with the gate having opposing edges and a center therebetween. At least one of chlorine or fluorine is concentrated in the gate oxide layer within the overlap more proximate at least one of the gate edges than the center. Preferably, the central region is substantially undoped with fluorine and chlorine. The chlorine and/or fluorine can be provided by forming sidewall spacers proximate the opposing lateral edges of the gate, with the sidewall spacers comprising at least one of chlorine or fluorine. The spacers are annealed at a temperature and for a time effective to diffuse the fluorine or chlorine into the gate oxide layer to beneath the gate. Transistors and transistor gates fabricated according to the above and other methods are disclosed. Further, a transistor includes a semiconductive material and a transistor gate having gate oxide positioned therebetween. A source is formed laterally proximate one of the gate edges and a drain is formed laterally proximate the other of the gate edges. First insulative spacers are formed proximate the gate edges, with the first insulative spacers being doped with at least one of chlorine or fluorine. Second insulative spacers formed over the first insulative spacers.

7 Claims, 4 Drawing Sheets

U.S. PATENT DOCUMENTS

| | | |
|---|---|---|
| 5,243,212 A | 9/1993 | Williams |
| 5,369,297 A | 11/1994 | Kasunoki et al. |
| 5,382,533 A | 1/1995 | Ahmad et al. |
| 5,506,178 A | 4/1996 | Suzuki et al. |
| 5,516,707 A | 5/1996 | Loh et al. ..................... 437/24 |
| 5,571,734 A | 11/1996 | Tseng et al. |
| 5,599,726 A | 2/1997 | Pan |
| 5,672,525 A | 9/1997 | Pan |
| 5,672,544 A | 9/1997 | Pan ........................... 437/200 |
| 5,705,409 A | 1/1998 | Witek |
| 5,710,450 A | 1/1998 | Chau et al. |
| 5,714,788 A | 2/1998 | Ngaoram |
| 5,716,875 A | 2/1998 | Jones, Jr. et al. |
| 5,721,170 A | 2/1998 | Bergemont |
| 5,750,435 A | 5/1998 | Pan |
| 5,763,312 A | 6/1998 | Jeng et al. |
| 5,807,771 A | 9/1998 | Vu et al. |
| 5,814,863 A | 9/1998 | Pan ........................... 257/344 |
| 5,831,319 A | 11/1998 | Pan |
| 5,851,890 A | 12/1998 | Tsai et al. |
| 5,923,949 A | 7/1999 | Gardner et al. |
| 6,004,857 A * | 12/1999 | Yeit et al. ................... 438/303 |
| 6,087,239 A * | 7/2000 | Juenguim ................... 438/302 |

OTHER PUBLICATIONS

The Effect of Fluorine on Gate Dielectric Properties, P.J. Wright, M. Wong and K.C. Saraswat, IEEE 1987, pp. 574–577.

*Microchip Fabrication*, $3^{rd}$ Edition, by Peter Van Zant, Chapter 11 "Doping," pp. 311–349.

Wolf, Ph.D., Stanley, "Silicon Processing for the VLSI Era –vol. 2: Process Integration," ©1990 Lattice Press, pp. 212–213.

* cited by examiner

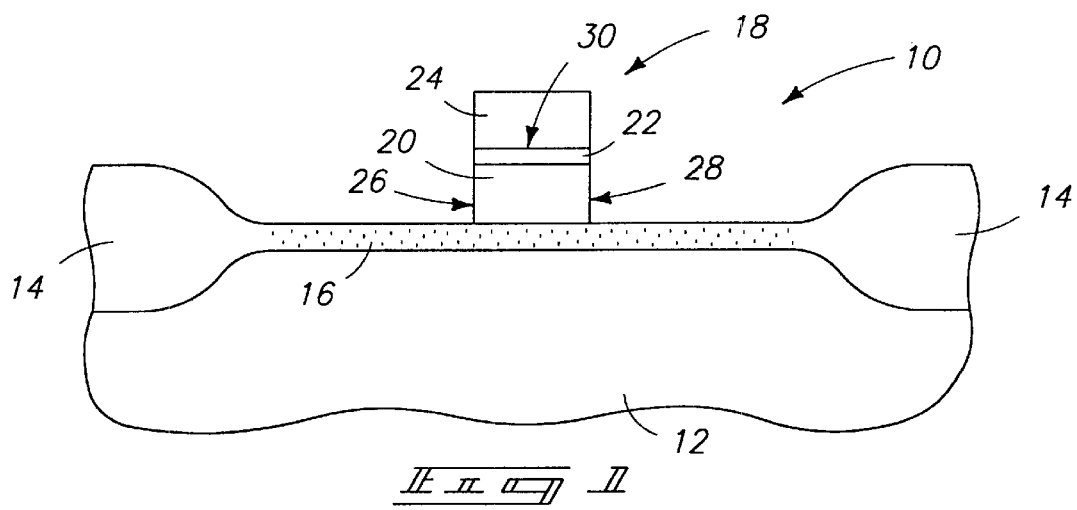
_Fig. 1_
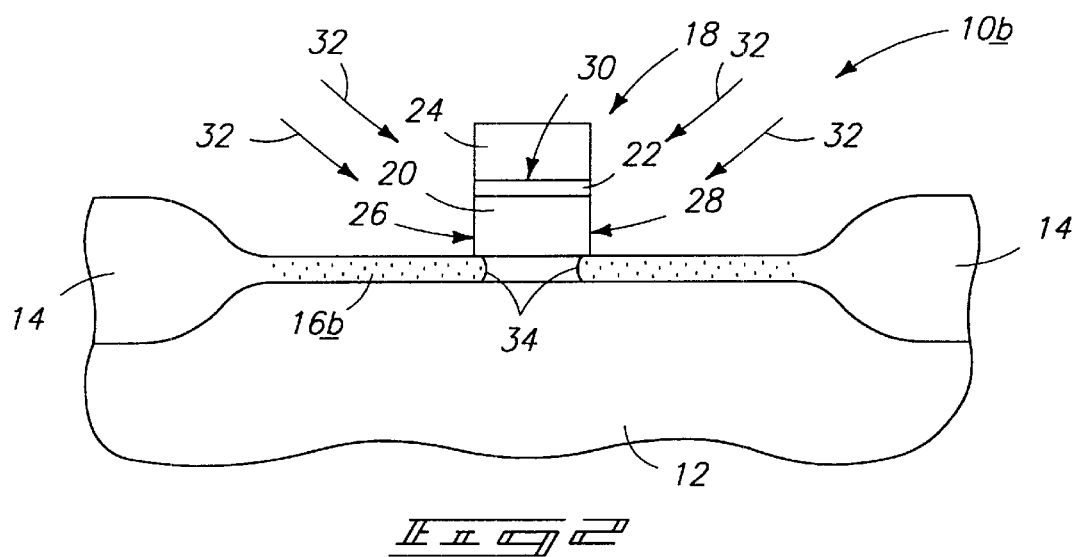
_Fig. 2_
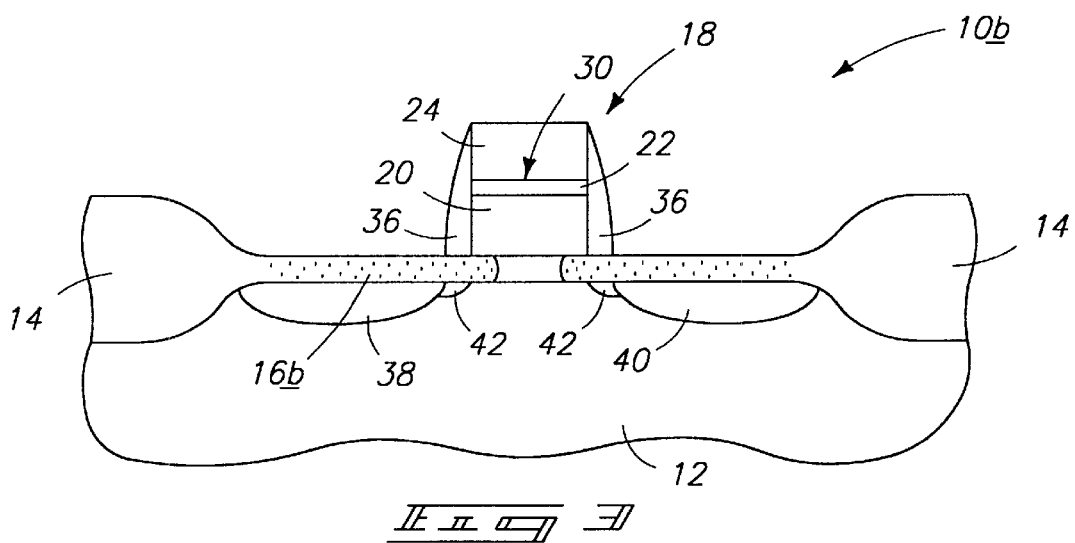
_Fig. 3_

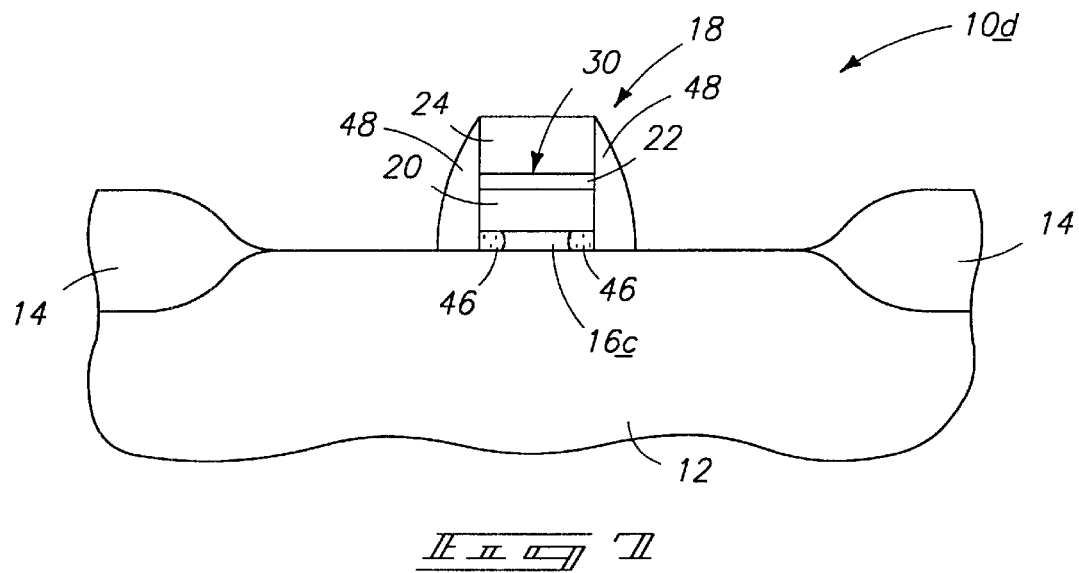
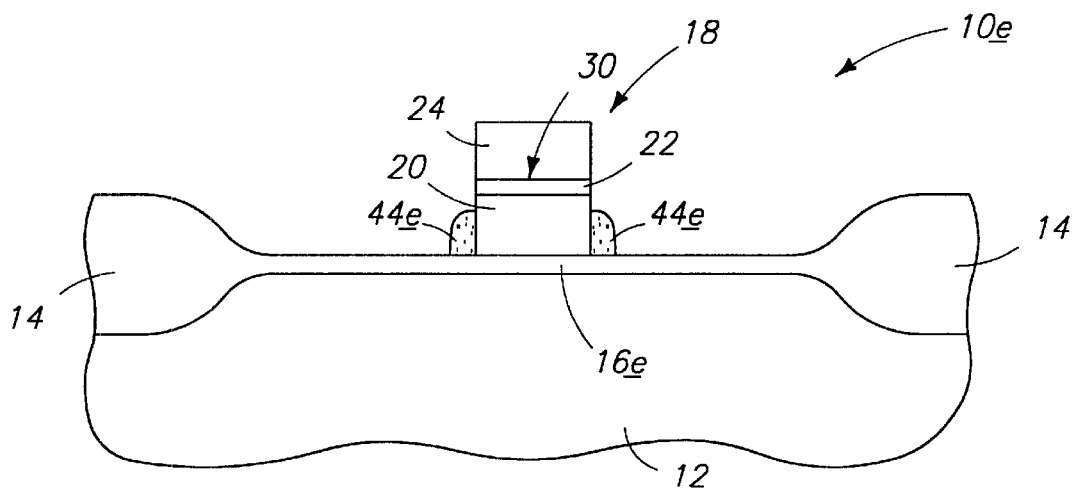

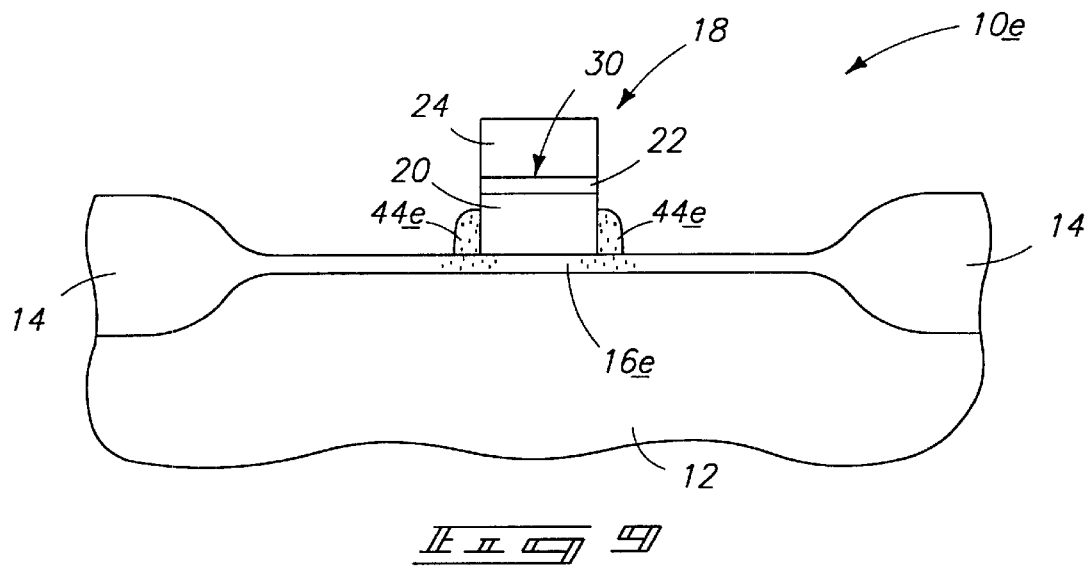
F I G 9
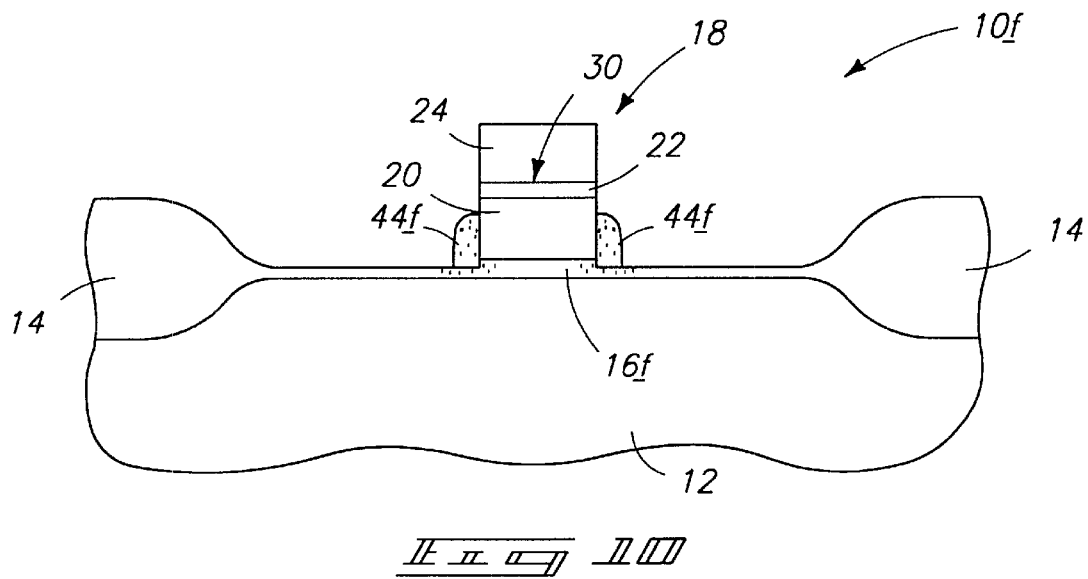
F I G 10

METHODS OF FORMING A TRANSISTOR GATE

RELATED PATENT DATA

This patent resulted from a continuation application of U.S. patent application Ser. No. 08/993,663, filed on Dec. 18, 1997, now U.S. Pat. No. 09/292,132.

TECHNICAL FIELD

This invention relates to methods of forming transistor gates and to transistor constructions.

BACKGROUND OF THE INVENTION

As transistor gate dimensions are reduced and the supply voltage remains constant, the lateral field generated in MOS devices increases. As the electric field becomes strong enough, it gives rise to so-called "hot-carrier" effects in MOS devices. This has become a significant problem in NMOS devices with channel lengths smaller than 1.5 micron, and in PMOS devices with sub-micron channel lengths.

High electric fields cause the electrons in the channel to gain kinetic energy, with their energy distribution being shifted to a much higher value than that of electrons which are in thermal equilibrium within the lattice. The maximum electric field in a MOSFET device occurs near the drain during saturated operation, with the hot electrons thereby becoming hot near the drain edge of the channel. Such hot electrons can cause adverse effects in the device.

First, those electrons that acquire greater than or equal to 1.5 eV of energy can lose it via impact ionization, which generates electron-hole pairs. The total number of electron-hole pairs generated by impact ionization is exponentially dependent on the reciprocal of the electric field. In the extreme, this electron-hole pair generation can lead to a form of avalanche breakdown. Second, the hot holes and electrons can overcome the potential energy barrier between the silicon and the silicon dioxide, thereby causing hot carriers to become injected into the gate oxide. Each of these events brings about its own set of repercussions.

Device performance degradation from hot electron effects have been in the past reduced by a number of techniques. One technique is to reduce the voltage applied to the device, and thus decrease in the electric field. Further, the time the device is under the voltage stress can be shortened, for example, by using a lower duty cycle and clocked logic. Further, the density of trapping sites in the gate oxide can be reduced through the use of special processing techniques. Also, the use of lightly doped drains and other drain engineering design techniques can be utilized.

Further, it has been recognized that fluorine-based oxides can improve hot-carrier immunity by lifetime orders of magnitude. This improvement is understood to mainly be due to the presence of fluorine at the $Si/SiO_2$ interface reducing the number of strained Si/O bonds, as fewer sites are available for defect formation. Improvements at the $Si/SiO_2$ interface reduces junction leakage, charge trapping and interface trap generation. However, optimizing the process can be complicated. In addition, electron-trapping and poor leakage characteristics can make such fluorine-doped oxides undesirable and provide a degree of unpredictability in device operation. Use of fluorine across the entire channel length has been reported in, a) K. Ohyu et al., "Improvement of $SiO_2/Si$ Interface Properties by Fluorine Implantation"; and b) P. J. Wright, et al., "the Effect of Fluorine On Gate Dielectric Properties".

SUMMARY OF THE INVENTION

In one implementation, a method of forming a transistor includes forming a gate oxide layer over a semiconductive substrate. Chlorine is provided within the gate oxide layer. A gate is formed proximate the gate oxide layer. In another aspect, a gate and a gate oxide layer are formed in overlapping relation, with the gate having opposing edges and a center therebetween. At least one of chlorine or fluorine is concentrated in the gate oxide layer within the overlap more proximate at least one of the gate edges than the center. The center is preferably substantially void of either fluorine or chlorine. In one implementation, at least one of chlorine or fluorine is angle ion implanted to beneath the edges of the gate. In another, sidewall spacers are formed proximate the opposing lateral edges, with the sidewall spacers comprising at least one of chlorine or fluorine. The spacers are annealed at a temperature and for a time period effective to diffuse the fluorine or chlorine from the spacers into the gate oxide layer to beneath the gate. Transistors fabricated by such methods, and other methods, are also contemplated.

BRIEF DESCRIPTION OF THE DRAWINGS

Preferred embodiments of the invention are described below with reference to the following accompanying drawings.

FIG. 1 is a sectional view of a semiconductor wafer fragment in accordance with the invention.

FIG. 2 is a sectional view of an alternate semiconductor wafer fragment at one step of a method in accordance with the invention.

FIG. 3 is a view of the FIG. 2 wafer at a processing step subsequent to that shown by FIG. 2.

FIG. 7 is a view of the FIG. 4 wafer at an alternate processing step to that depicted by FIG. 6.

FIG. 8 is a sectional view of another semiconductor wafer fragment at another processing step in accordance with the invention.

FIG. 9 is a view of the FIG. 8 wafer at a processing step subsequent to that depicted by FIG. 8.

FIG. 10 is a sectional view of still another embodiment wafer fragment at a processing step in accordance with another aspect of the invention.

DETAILED DESCRIPTION OF THE PREFERRED EMBODIMENTS

Figure 4:
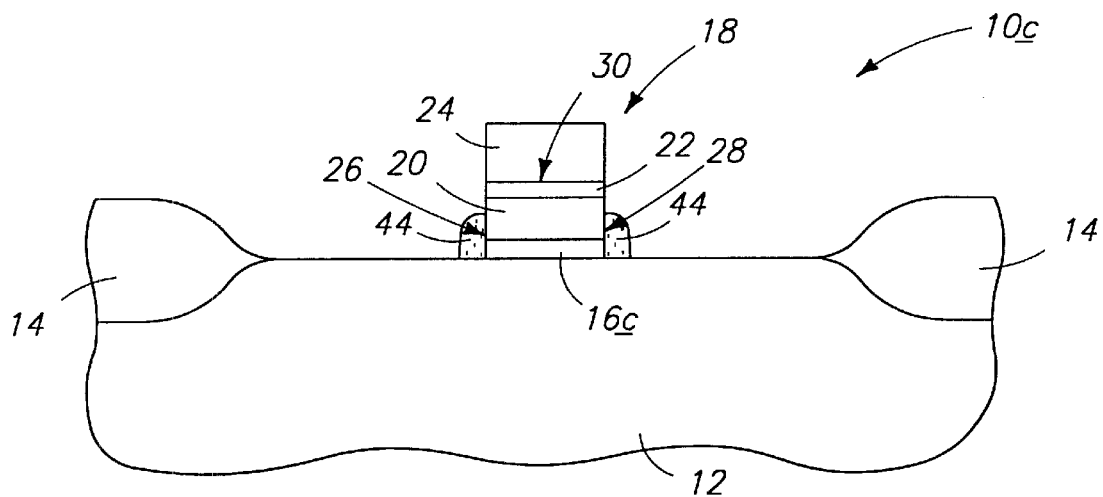
FIG. 4 is a sectional view of another semiconductor wafer fragment at an alternate processing step in accordance with the invention.

This disclosure of the invention is submitted in furtherance of the constitutional purposes of the U.S. Patent Laws "to promote the progress of science and useful arts" (Article 1, Section 8).

A semiconductor wafer fragment in process is indicated in FIG. 1 with reference numeral 10. Such comprises a bulk semiconductive substrate 12 which supports field oxide regions 14 and a gate oxide layer 16. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A gate structure 18 is formed proximate gate oxide 16, such as in an overlapping relationship. A top gated construction is shown, although bottom gated constructions could also be utilized. Gate construction 18 is comprised of a first conductive material portion 20 (i.e., conductively doped polysilicon), and a higher conductive layer 22 (i.e., a silicide such as $WSi_x$). An insulating cap 24 is provided over layer 22, with $SiO_2$ and $Si_3N_4$ being example materials. For purposes of the continuing discussion, gate construction 18 defines opposing gate edges 26 and 28, and a center 30 therebetween. The invention is believed to have its greatest impact where the gate width between edges 26 and 28 (i.e., the channel length) is 0.25 micron or less.

Chlorine is provided within gate oxide layer 16 as indicated in the figure by the hash marks, and thus between semiconductive material of substrate 12 and transistor gate 18. Chlorine can be provided before or after formation of gate construction 18. For example, the chlorine in layer 16 can be provided by gas diffusion, ion implantation or in situ as initially deposited or formed. Preferred dopant concentration of the chlorine within oxide layer 16 is from about $1 \times 10^{19}$ atoms/cm$^3$ to about $1 \times 10^{21}$ atoms/cm$^3$. A source, a drain, and insulating sidewall spacers over gate construction 18 can be provided. Chlorine based gate oxides can improve hot-carrier immunity. The chlorine present at the $Si/SiO_2$ interface reduces the number of strained Si/O bonds, as fewer sites are available for defect formation. Improvements at the $Si/SiO_2$ interface will reduce junction leakage, the probability of charge trapping and interface state generation, thus improving device characteristics.

A second embodiment is described with reference to FIGS. 2 and 3. Like numerals from the first described embodiment are utilized when appropriate, with differences being indicated by the suffix "b" or with different numerals. Wafer fragment 10b ideally comprises a gate oxide layer 16b which is initially provided to be essentially undoped with chlorine. The FIG. 2 construction is subjected to angle ion implanting (depicted with arrows 32) to implant at least one of chlorine or fluorine into gate oxide layer 16b beneath edges 26 and 28 of gate 18. A preferred angle for the implant is between from about 0.5° to about 10° from perpendicular to gate oxide layer 16b. An example energy range is from 20 to 50 keV, with 50 keV being a preferred example. An example implant species is $SiF_3$, to provide a fluorine dose of from about $1 \times 10^{15}$ atoms/cm$^2$ to about $3 \times 10^{15}$ atoms/cm$^2$, with $2 \times 10^{15}$ atoms/cm$^2$ being a specific example. The resultant preferred implanted dopant concentration within layer 16b is from about $1 \times 10^{19}$ atom/cm$^3$ to about $1 \times 10^{21}$ atoms/cm$^3$.

The concentrated regions from such preferred processing will extend inwardly within gate oxide layer 16b relative to gate edges 26 and 28 a preferred distance of from about 50 Angstroms to about 500 Angstroms. Such is exemplified in the Figures by boundaries 34. In the physical product, such boundaries would not physically exist, but rather the implant concentration would preferably appreciably drop off over a very short distance of the channel length.

Annealing is preferably subsequently conducted to repair damage to the gate oxide layer caused by the ion implantation. Example conditions include exposure of the substrate to a temperature of from 700° C. to 1000° C. in an inert atmosphere such as $N_2$ at a pressure from 100 mTorr–760 Torr for from about 20 minutes to 1 hour. Such can be conducted as a dedicated anneal, or in conjunction with other wafer processing whereby such conditions are provided. Such will also have the effect of causing encroachment or diffusion of the implanted atoms to provide barriers 34 to extend inwardly from edges 26 and 28 approximately from about 50 Angstroms to about 500 Angstroms.

Such provides but one example of doping and concentrating at least one of chlorine or fluorine in the gate oxide layer within the overlap region between the semiconductive material and the gate more proximate the gate edges 26 and 28 than gate center 30. Such preferably provides a pair of spaced and opposed concentration regions in the gate oxide layer, with the area between the concentration regions being substantially undoped with chlorine and fluorine. In the context of this document, "substantially undoped" and "substantially void" means having a concentration range of less than or equal to about $1 \times 10^{16}$ atoms/cm$^3$.

Referring to FIG. 3, subsequent processing is illustrated whereby insulative sidewall spacers 36 are formed over the gate edges. A source region 38 and a drain region 40, as well as LDD regions 42, are provided.

The FIGS. 2–3 embodiment illustrated exemplary provision of concentrated regions more proximate the gate edges by angle ion implanting and subsequent anneal. Alternate processing is described with other embodiments with reference to FIGS. 4–10. A first alternate embodiment is shown in FIGS. 4–6, with like numerals from the first described embodiment being utilized where appropriate, with differences being indicated with the suffix "c" or with different numerals.

Wafer fragment 10c is shown at a processing step subsequent to that depicted by FIG. 1 (however preferably with no chlorine provided in the gate oxide layer). The gate oxide material of layer 16c is etched substantially selective relative to silicon to remove oxide thereover, as shown. A layer of oxide to be used for spacer formation is thereafter deposited over substrate 12 and gate construction 18c. Such is anisotropically etched to form insulative sidewall spacers 44 proximate opposing lateral edges 26 and 28 of gate 18. Preferably as shown, such spacers are formed to cover less than all of the conductive material of lateral edges 26 and 28 of gate 18. Further in this depicted embodiment, such spacers 44 do not overlie any gate oxide material over substrate 12, as such has been completed etched away.

Spacers 44 are provided to be doped with at least one of chlorine or fluorine, with an example dopant concentration being $1 \times 10^{21}$ atoms/cm$^3$. Such doping could be provided in any of a number of ways. For example, the deposited insulating layer from which spacers 44 are formed, for example $SiO_2$, could be in situ doped during its formation to provide the desired fluorine and/or chlorine concentration. Alternately, such could be gas diffusion doped after formation of such layer, either before or after the anisotropic etch to form the spacers. Further alternately, and by way of example only, ion implanting could be conducted to provide a desired dopant concentration within spacers 44.

Figure 5:
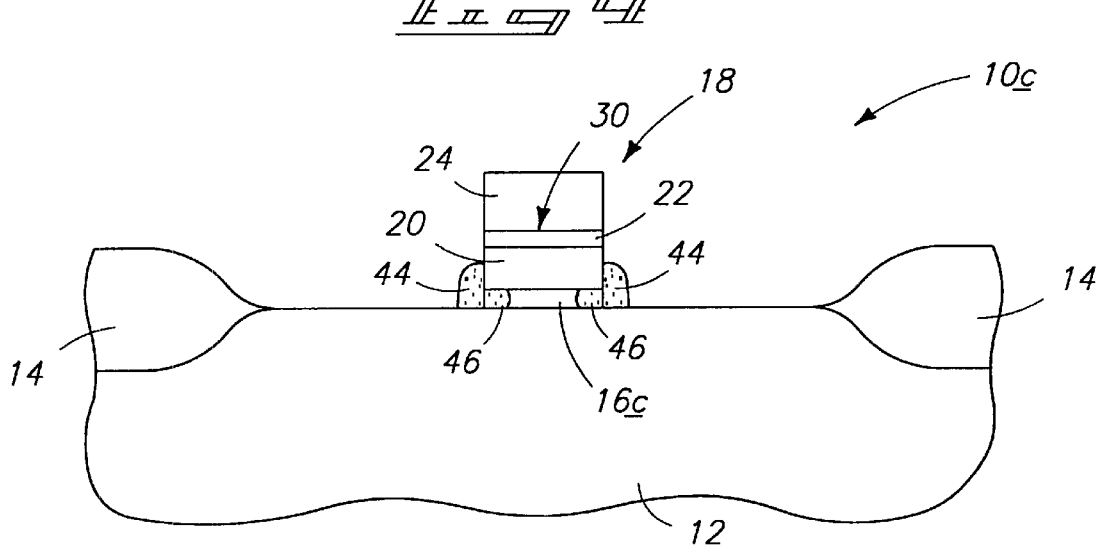
FIG. 5 is a view of the FIG. 4 wafer fragment at a processing step subsequent to that depicted by FIG. 4.
Figure 6:
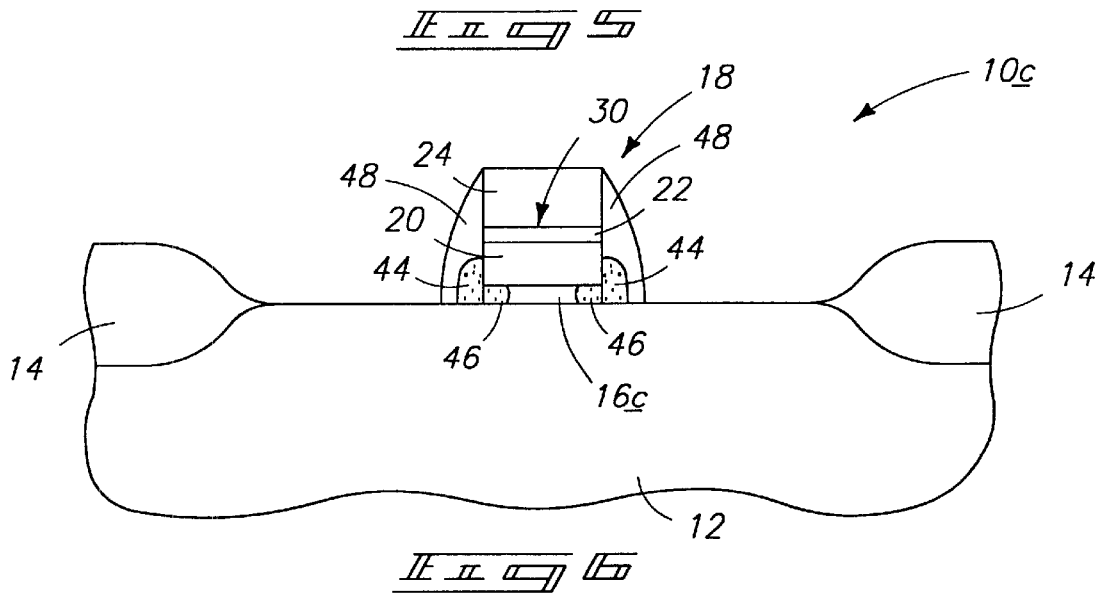
FIG. 6 is a view of the FIG. 4 wafer fragment at a processing step subsequent to that depicted by FIG. 5.

Referring to FIG. 5, spacers 44 are annealed at a temperature and for a time period effective to diffuse the dopant fluorine or chlorine from such spacers into gate oxide layer 16c beneath gate 18. Sample annealing conditions are as described above with respect to repair of ion implantation damage. Such can be conducted as a dedicated anneal, or as a byproduct of subsequent wafer processing wherein such conditions are inherently provided. Such provides the illustrated concentration regions 46 proximate lateral edges 26 and 28 with gate oxide material therebetween preferably being substantially undoped with either chlorine or fluorine.

Referring to FIG. 6, another layer of insulating material (i.e., silicon nitride or silicon dioxide) is deposited over gate 18 and sidewall spacers 44. Such is anisotropically etched to form spacers 48 about spacers 44 and gate construction 18. Preferably, such spacer 48 formation occurs after annealing to cause effective diffusion doping from spacers 44 into gate oxide layer 16c.

Alternate processing with respect to FIG. 5 is shown in FIG. 7. Like numerals from the first described embodiment are utilized where appropriate with differences being indicated with the suffix "d". Here in a wafer fragment 10d, doped spacers 44 have been stripped from the substrate prior to provision of spacers 48. Accordingly, diffusion doping of chlorine or fluorine from spacers 44 would be conducted prior to such stripping in this embodiment. The FIG. 7 processing is believed to be preferred to that of FIG. 6, such that the chlorine or fluorine dopant atoms won't have any adverse effect on later or other processing steps in ultimate device operation or fabrication. For example, chlorine and fluorine may not be desired in the preferred polysilicon material of the gate.

A next alternate embodiment is described with reference to FIGS. 8 and 9. Like numerals from the first described embodiment are utilized where appropriate, with differences being indicated with the suffix "e" or with different numerals. FIG. 8 illustrates a wafer fragment 10e which is similar to that depicted by FIG. 4 with the exception that gate oxide layer 16e has not been stripped or etched laterally outward of gate edges 26 and 28 prior to spacer 44e formation. Accordingly in such embodiment, spacers 44e are formed to overlie gate oxide layer 16e.

Referring to FIG. 9, such spacers are subjected to appropriate annealing conditions as described above to cause diffusion doping of the chlorine or fluorine into the gate oxide layer 16e and beneath gate 18 from laterally outward of gate edges 26 and 28. This embodiment is not believed to be as preferred as those depicted by FIGS. 4–7, in that the dopant must diffuse both initially downwardly into gate oxide layer 16 and then laterally to beneath gate edges 26 and 28.

Yet another alternate embodiment is described with reference to FIG. 10. Like numerals from the first described embodiment are utilized where appropriate, with differences being indicated with the suffix "f". FIG. 10 is similar to the FIGS. 8–9 embodiment. However, gate oxide layer 16f is etched only partially into laterally outward of gate edges 26 and 28, thus reducing its thickness. Chlorine and/or fluorine doped spacers 44f are subsequently formed as described above. A diffusion annealing is then conducted. In comparison to the FIG. 8 embodiment, the FIG. 10 embodiment provides a portion of gate oxide layer 16f to be laterally outwardly exposed, such that dopant diffusion to beneath gate edges 26 and 28 is facilitated.

Provision of fluorine and/or chlorine at the edges, with a central region therebetween being substantially void of same, reduces or eliminates any adverse affect chlorine and/or fluorine would have at the center of the gate where hot electron carrier effects are not as prominent.

The above-described embodiments preferably place doped chlorine or fluorine proximate both gate edges 26 and 28 within the respective gate oxide layers. Alternately, such greater concentration could be provided proximate only one of the gate edges, such as the drain edge where the hot carrier effects are most problematic.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a transistor gate comprising the following steps:

forming a gate over a gate oxide layer, the gate having opposing lateral edges;

forming sidewall spacers proximate the opposing lateral edges, the sidewall spacers comprising at least one of chlorine or fluorine;

depositing a layer of insulating material over the gate and the sidewall spacers;

anisotropically etching the layer of insulating material to form spacers over the sidewall spacers; and annealing the spacers at a temperature and for a time period effective to diffuse the fluorine or chlorine from the spacers into the gate oxide layer to beneath the gate wherein the annealing occurs after the depositing.

2. The method of claim 1 comprising forming the sidewall spacers to cover less than all of the lateral edges.

3. The method of claim 1 comprising forming the spacers to overlie the gate oxide layer.

4. The method of claim 1 comprising forming the spacers to not overlie any of the gate oxide layer.

5. The method of claim 1 further comprising:

providing gate oxide layer material laterally outward of the gate edges;

etching only partially into the gate oxide layer laterally outward of the gate edges; and forming said sidewall spacers over the etched gate oxide layer laterally outward of the gate edges.

6. The method of claim 1 wherein the sidewall spacers comprise upper surfaces, and wherein the gate comprises an uppermost surface elevationally above the upper surface of the sidewall spacers.

7. A method of forming a transistor gate comprising the following steps:

providing a substrate;

forming a gate oxide layer over the substrate, the gate oxide layer having opposing lateral edges;

forming a gate over the gate oxide layer, the gate having opposing lateral edges aligned with the lateral edges of the gate oxide layer;

forming sidewall spacers proximate the opposing lateral edges of the gate and the gate oxide layer and the sidewall spacers individually having a top surface and a bottom surface, the bottom surface contacting the substrate, and the individual spacers further having a substantially uniform thickness intermediate the top surface of the spacer and the substrate wherein the bottom surface of the spacers contact the substrate, the sidewall spacers comprising at least one of chlorine or fluorine; and annealing the spacers at a temperature and for a time period effective to diffuse the fluorine or chlorine from the spacers into the gate oxide, wherein the gate comprises an uppermost surface elevationally above the top surface of the side wall spacers.

* * * * *

UNITED STATES PATENT AND TRADEMARK OFFICE
CERTIFICATE OF CORRECTION

PATENT NO. : 6,593,196 B2  
DATED : July 15, 2003  
INVENTOR(S) : Akram et al.

It is certified that error appears in the above-identified patent and that said Letters Patent is hereby corrected as shown below:

Title page,  
Item [56], References Cited, U.S. PATENT DOCUMENTS, replace "6,004,857 A * 12/1999 Yeit et al." with -- 6,004,852 * 12/1999 Yeh et al. --.

Column 1,  
Line 7, delete "now U.S. Pat. No. 09/292,132".  
Line 66, replace "the" with -- The --.

Column 3,  
Line 50, replace "$1X^{15}$" with -- $1X10^{15}$ --.

Column 4,  
Line 47, replace "completed" with -- completely --.

Signed and Sealed this

Thirtieth Day of December, 2003

JAMES E. ROGAN  
*Director of the United States Patent and Trademark Office*